(12) United States Patent
Won et al.

(10) Patent No.: US 8,130,577 B2
(45) Date of Patent: Mar. 6, 2012

(54) SEMICONDUCTOR MEMORY DEVICE

(75) Inventors: Jong-Hak Won, Hwaseong-si (KR);
Young-Soo An, Yongin-si (KR);
Jung-Hyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 294 days.

(21) Appl. No.: 12/590,417

(22) Filed: Nov. 6, 2009

(65) Prior Publication Data

US 2010/0118615 A1    May 13, 2010

(30) Foreign Application Priority Data

Nov. 7, 2008   (KR) .................. 10-2008-0110364

(51) Int. Cl.
*G11C 8/00*   (2006.01)
(52) U.S. Cl. .................... 365/203; 365/205; 365/207
(58) Field of Classification Search .................. 365/203, 365/205, 207, 63, 230.03, 230.06
See application file for complete search history.

(56) References Cited

U.S. PATENT DOCUMENTS

| | | | |
|---|---|---|---|
| 6,097,648 A | 8/2000 | Bessho et al. | |
| 2007/0014141 A1* | 1/2007 | Lee et al. | 365/63 |
| 2007/0070756 A1 | 3/2007 | Kim et al. | |
| 2010/0091589 A1* | 4/2010 | Lee | 365/191 |

FOREIGN PATENT DOCUMENTS

| | | |
|---|---|---|
| JP | 10302472 | 11/1998 |
| KR | 102002006877 A | 8/2002 |
| KR | 100512212 | 4/2006 |
| KR | 100744657 | 8/2007 |

\* cited by examiner

*Primary Examiner* — Richard Elms
*Assistant Examiner* — Hien Nguyen
(74) *Attorney, Agent, or Firm* — Onello & Mello, LLP

(57) ABSTRACT

A semiconductor memory device includes a sub memory cell array region having memory cells each connected between word lines extending in a first direction and bit lines extending in a second direction that is orthogonal to the first direction of extension of the word lines and a sub word line driver region disposed at a side of the sub memory cell array region in the first direction and including sub word line drivers that activate the word lines. A sensing region is disposed at a side of the sub memory cell array region in the second direction and including an equalizer that precharges the bit line in response to a signal transferred through a drive signal line and at least one first control signal driver that activates an inverted control signal line in response to a signal transferred through a control signal line. A conjunction region disposed at an intersection between the sub word line driver region and the sensing region, in which the inverted control signal line is connected to the drive signal line.

10 Claims, 6 Drawing Sheets

SEMICONDUCTOR MEMORY DEVICE

PRIORITY STATEMENT

This application claims the benefit of priority under 35 U.S.C. §119 from Korean Patent Application No. 10-2008-0110364, filed on Nov. 7, 2008, the contents of which are incorporated herein by reference in their entirety.

BACKGROUND

1. Field

Example embodiments relate to semiconductor memory devices, and more particularly, to semiconductor memory devices in which interconnection of control signal lines controlling circuits of sensing regions on which sense amplifiers and equalizers are disposed are improved, and in which the arrangement of control signal drivers activating the control signal lines are improved.

2. Description of Related Art

Semiconductor memory devices are commonly equipped with sensing regions for detecting and amplifying data transferred through bit lines. If a word line is selectively activated, the data stored memory cells that are coupled to the selected word line are transferred to the sensing region by way of bit lines. The sensing region detects and amplifies the data transferred through the bit lines, and outputs the detected and amplified data. The sensing region may include an equalizer, an NMOS sense amplifier, and a PMOS sense amplifier, each of which is operable in response to signals transferred through drive signal lines arranged in a word line direction of the device.

SUMMARY

Example embodiments provide a semiconductor memory device capable of reducing performance degradation that may otherwise be caused by an increase of loading on drive signal lines activating circuits of sensing regions.

In one aspect, a semiconductor memory device comprises: a sub memory cell array region having memory cells each connected between word lines extending in a first direction and bit lines extending in a second direction that is orthogonal to the first direction of extension of the word lines; a sub word line driver region disposed at a side of the sub memory cell array region in the first direction and including sub word line drivers that activate the word lines; a sensing region disposed at a side of the sub memory cell array region in the second direction and including an equalizer that precharges the bit line in response to a signal transferred through a drive signal line and at least one first control signal driver that activates an inverted control signal line in response to a signal transferred through a control signal line; and a conjunction region disposed at an intersection between the sub word line driver region and the sensing region, in which the inverted control signal line is connected to the drive signal line.

In one embodiment, the conjunction region further comprises a second control signal driver configured to activate the inverted control signal line in response to the signal transferred through the control signal line.

In another embodiment, the sensing region further comprises: a sense amplifier portion configured to detect and amplify data transferred through the bit line; an equalizer portion in which the equalizer is disposed; a bit line selection portion in which the bit line is connected to a local data input/output line; and a local/global input/output multiplexing portion in which the local data input/output line is connected to a global data input/output line, wherein the first control signal driver is disposed in the local/global input/output multiplexing portion of the sensing region.

In another embodiment, the sense amplifier portion, the equalizer portion, the local/global input/output multiplexing portion and the bit line selection portion are arranged in the sensing region side-by-side in the second direction.

In another embodiment, the inverted control signal line is connected at least once to the drive signal line in the sensing region.

In another embodiment, the sensing region further comprises: a sense amplifier portion configured to detect and amplify data transferred through the bit line; an equalizer portion in which the equalizer is disposed; a bit line selection portion in which the bit line is connected to a local data input/output line; and a local/global input/output multiplexing portion in which the local data input/output line is connected to a global data input/output line, wherein the inverted control signal line is connected to a first lead extending to the local/global input/output multiplexing portion, the drive signal line is connected to a second lead extending to the local/global input/output multiplexing portion, and the first lead is strapped with the second lead in the local/global input/output multiplexing portion.

In another embodiment, the control signal line and the inverted control signal line are formed of metal and the drive signal line is formed of gate polycrystalline silicon.

In another aspect, a semiconductor memory device comprises: a sub memory cell array region having memory cells each connected between word lines extending in a first direction and bit lines extending in a second direction that is orthogonal to the first direction of extension of the word lines; a sub word line driver region disposed at a side of the sub memory cell array region in the first direction and including sub word line drivers that activate the word lines; a sensing region disposed at a side of the sub memory cell array region in the second direction and including an equalizer that precharges the bit line in response to a signal transferred through a drive signal line; and a conjunction region disposed at an intersection between the sub word line driver region and the sensing region and including a control signal driver that activates an inverted control signal line in response to a signal transferred through a control signal line, the inverted control signal line being connected to the drive signal line in the conjunction region, wherein the drive signal line is connected at least once to the inverted control signal line in the sensing region.

In one embodiment, the sensing region further comprises: a sense amplifier portion configured to detect and amplify data transferred through the bit line; an equalizer portion in which the equalizer is disposed; a bit line selection portion in which the bit line is connected to a local data input/output line; and a local/global input/output multiplexing portion in which the local data input/output line is connected to a global data input/output line, wherein the inverted control signal line is connected to a first lead extending to the local/global input/output multiplexing portion, the drive signal line is connected to a second lead extending to the local/global input/output multiplexing portion, and the first lead is strapped with the second lead in the local/global input/output multiplexing portion of the sensing region.

In another embodiment, the control signal line and the inverted control signal line are formed of metal and the drive signal line is formed of gate polycrystalline silicon.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
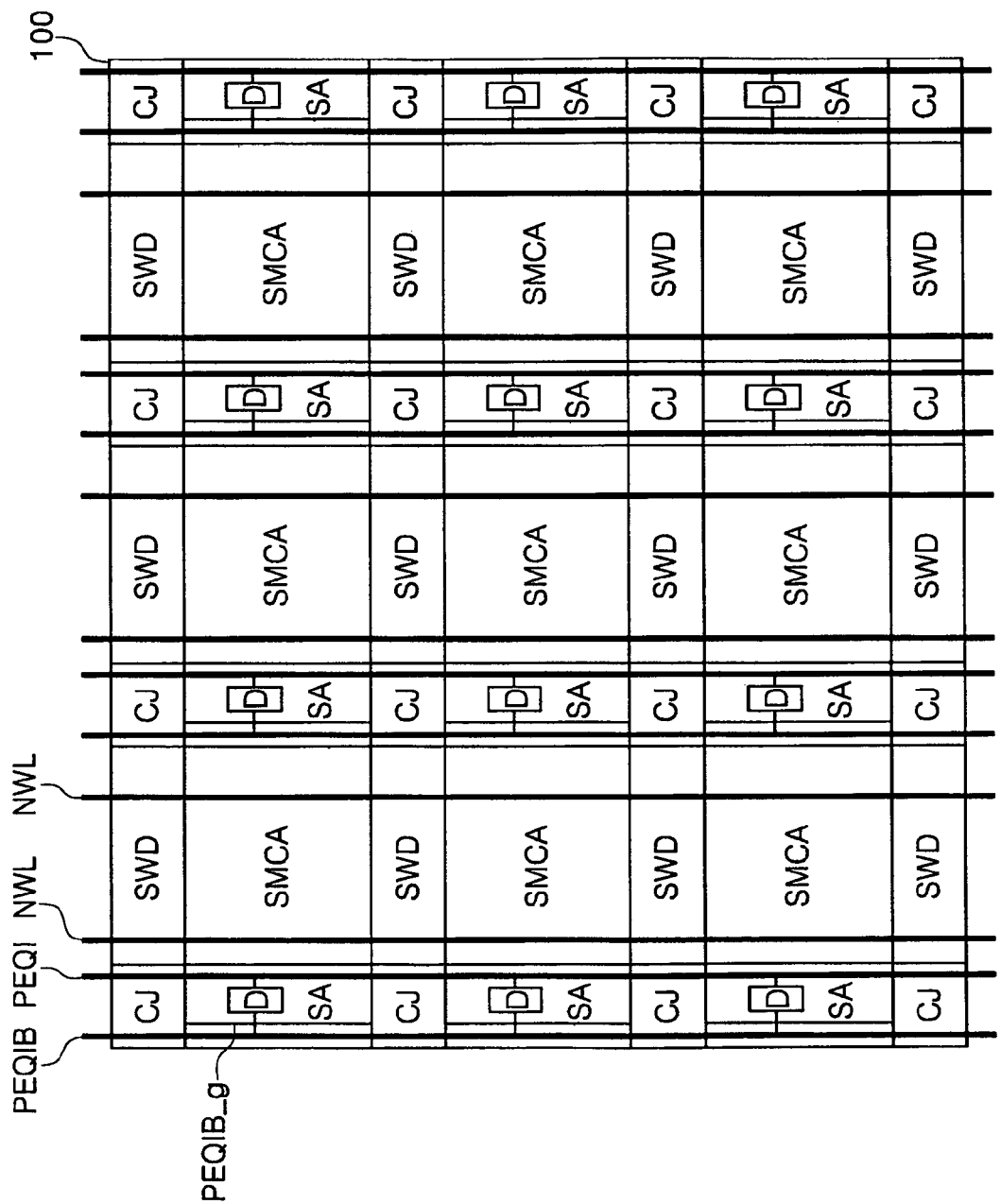
FIG. 1 is a diagram illustrating a configuration of a memory cell array according to an example embodiment.

Various example embodiments will now be described more fully with reference to the accompanying drawings. Specific structural and functional details disclosed below are only examples chosen to describe the example embodiments. The invention may be embodied in many alternate forms and should not be construed as limited to the example embodiments set forth herein. Like reference numerals refer to like elements throughout the drawings.

It will be understood that, although terms such as "first" and "second" may be used herein to distinguish one element from another, these terms are not limiting. For example, a first element could be termed a second element and vice versa without any change in structure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

All terminology used herein is intended to describe particular example embodiments only should not be construed as limiting the scope of the invention. Use of the singular form to refer to an element of the invention, such as "an element" or "the element", does not exclude the possibility of there being a plurality of said elements in the invention, unless the context clearly indicates otherwise. It will be further understood that the terms "comprise" and "include" used specify the presence of stated features, numbers, steps, operations, elements and/or components, do not preclude the presence or addition of one or more other features, numbers, steps, operations, elements, components and/or groups thereof.

In order to more specifically describe example embodiments, various aspects will be described in detail with reference to the attached drawings. However, the present invention is not limited to example embodiments described.

FIG. 1 illustrates a configuration of a memory cell array 100 according to an example embodiment. In FIG. 1, the memory cell array 100 includes conjunction regions CJ, sub word line driver regions SWD, sub memory cell array regions SMCA, and sensing regions SA. The memory cell array 100 also includes main word lines NWL, equalizer control signal lines PEQI, inverted equalizer control signal lines PEQIB, equalizer drive signal lines PEQIB_g, and equalizer control signal drivers D.

In the memory cell array 100 shown in FIG. 1, a plurality of blocks, each composed of a junction region CJ, a sub word line driver region SWD, a sensing region SA, and a sub memory cell array region SMCA, are repeatedly arranged in row and column directions. The sensing region SA includes a bit line equalizer (not shown), a sense amplifier (not shown) formed of NMOS and PMOS sense amplifiers, and the equalizer control signal driver D for activating an inverted equalizer control signal line. The sub word line driver region SWD includes sub word line drivers (not shown). The conjunction region CJ includes a control signal generator (not shown) for controlling the sub word line driver, and control signal drivers (not shown) for activating control signal lines controlling the equalizer and the sense amplifier. The main word lines NWL, the equalizer control signal lines PEQI, and the inverted equalizer control signal line PEQIB may comprise, for example, a metal material. The equalizer drive signal line PEQIB_g may comprise, for example, gate polycrystalline silicon.

Detailed configurations and functions of the blocks shown in FIG. 1 will now be described as follows.

The sub memory cell array region SMCA includes memory cells connected between word lines extending in a first direction and bit lines extending in a second direction that is orthogonal to the direction of extension of the word lines. The SMCA operates to write/read data to/from selected memory cells.

The sub word line driver region SWD is positioned or placed at a side of the sub memory cell array region SMCA in the first, or word line, direction. A sub word line driver of the sub word line driver region SWD selectively activates a word line by combining an output signal of the control signal generator (not shown) disposed in the conjunction region CJ with a signal transferred through the main word line NWL.

The sensing region SA is disposed at a side of the sub memory cell array region SMCA in the second, or bit line, direction. The equalizer of the sensing region SA precharges a bit line and the sense amplifier of the sensing region SA amplifies data present on the bit line. The control signal driver D of the sensing region SA activates the inverted equalizer control signal line PEQIB in response to a signal transferred through the equalizer control signal line PEQI.

The conjunction region CJ is disposed at an intersection between the sub word line driver region SWD and the sensing region SA. The control signal driver D of the conjunction region CJ activates the inverted equalizer control signal line PEQIB in response to a signal (i.e., equalizer control signal) transferred through the equalizer control signal line PEQI. Further, the inverted equalizer control signal line PEQIB is connected to the equalizer drive signal line PEQIB_g in the conjunction region CJ.

Although not shown, the main word lines NWL, the equalizer control signal lines PEQI, and the inverted equalizer control signal lines PEQIB may be controlled by a row controller (not shown).

Figure 2:
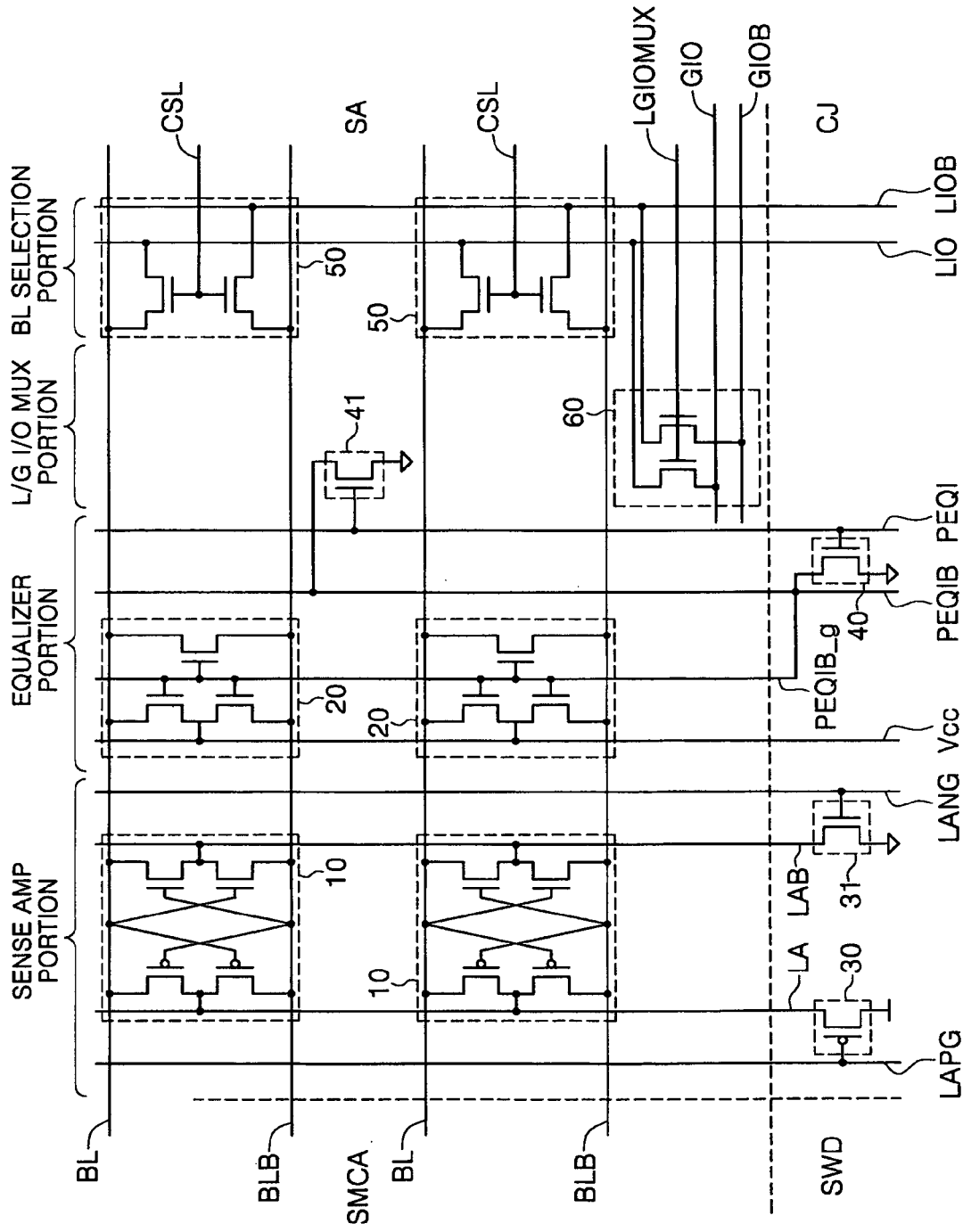
FIG. 2 is a circuit diagram partly illustrating the memory cell array of FIG. 1 in detail.

FIG. 2 partly illustrates the memory cell array of FIG. 1 in detail, showing a bit line sense amplifier 10, an equalizer 20, a PMOS drive signal driver 30, an NMOS drive signal driver 31, a first equalizer control signal driver 40, a second equalizer control signal driver 41, a bit line selector 50, and a local/global input/output gate 60. In FIG. 2, a bit line BL, an inverted bit line BLB, a PMOS sense amplifier control signal line LAPG, an NMOS sense amplifier control signal line LANG, a PMOS sense amplifier drive signal line LA, an NMOS sense amplifier drive signal line LAB, the equalizer control signal line PEQI, the inverted equalizer control signal line PEQIB, the equalizer drive signal line PEQIB_g, a column selection line CSL, a local data input/output line LIO, an inverted local data input/output line LIOB, a global data input/output line GIO, and an inverted global data input/output line GIOB are also shown.

With reference to FIG. 2, the configurations and operations of the circuit elements will now be described.

The PMOS drive signal driver 30 is disposed or positioned in the conjunction region CJ and activates the PMOS sense amplifier drive signal line LA in response to a signal (i.e., PMOS sense amplifier control signal) transferred through the PMOS sense amplifier control signal line LAPG. The NMOS drive signal driver 31 is also disposed in the conjunction region CJ and activates the NMOS sense amplifier drive signal line LAB in response to a signal (i.e., NMOS sense amplifier control signal) transferred through the NMOS sense amplifier control signal line LANG.

The first equalizer control signal driver 40 is disposed in the conjunction region CJ and activates the inverted equalizer control signal line PEQIB and the equalizer drive signal line PEQIB_g in response to the equalizer control signal transferred through the equalizer control signal line PEQI. The inverted equalizer control signal line PEQIB is connected to the equalizer drive signal line PEQIB_g in the conjunction region CJ.

The second equalizer control signal driver 41 is disposed in the sensing region SA and activates the inverted equalizer control signal line PEQIB in response to the equalizer control signal transferred through the equalizer control signal line PEQI. Further, the second equalizer control signal driver 41 may be disposed in a local/global input/output multiplexing portion placed at the location of the equalizer in the sensing region SA in order to scale down a layout area of the sensing region, permitting further integration of the resulting device.

The sensing region SA includes a sense amplifier portion in which the bit line sense amplifiers 10 for sensing and amplifying data transferred through the bit line BL and the inverted bit line BLB are disposed, an equalizer portion in which the equalizers 20 for precharging the bit line BL and the inverted bit line BLB are disposed, a bit line selection portion in which the bit line BL and the inverted bit line BLB are each connected to the local data input/output line LIO and the inverted local data input/output line LIOB, and a local/global input/output multiplexing (L/G I/O MUX) portion in which the local data input/output line LIO and the inverted local data input/output line LIOB are each connected to the global data input/output line GIO and the inverted global data input/output line GIOB. In this embodiment, each of the sense amplifier portion, the equalizer portion, the bit line selection portion and the local/global input/output multiplexing (L/G I/O MUX) portion are arranged in the sensing region side-by-side in the second direction.

The bit line sense amplifier 10 disposed in the sense amplifier portion of the sensing region SA may be composed of a PMOS sense amplifier that is made up of two PMOS transistors, and an NMOS sense amplifier that is made up of two NMOS transistors. The bit line sense amplifier 10 detects and amplifies a voltage gap between the bit lines BL and BLB in response to PMOS and NMOS sense amplifier drive signals transferred through the PMOS and NMOS sense amplifier drive signal lines LA and LAB, respectively.

The equalizer 20 disposed in the equalizer portion of the sensing region SA precharges the bit line pair BL and BLB to a predetermined precharge voltage (e.g., Vcc/2) in response to a signal (i.e., equalizer drive signal) transferred through the equalizer drive signal line PEQIB_g.

The bit line selector 50 disposed in the bit line selection portion of the sensing region SA is composed of two bit line gates and connects a selected one of a plurality of bit line pairs, BL and BLB, to the local input/output line pair LIO and LIOB in response to a signal transferred through the column selection signal line CSL activated by decoding a column address. The column selection line CSL may be activated by a column decoder (not shown).

The local/global input/output gate 60 disposed in the local/global input/output multiplexing (L/G I/O MUX) portion of the sensing region SA is composed of two global gates. The local/global input/output gate 60 connects a pair of the local input/output lines LIO and LIOB to a pair of the global input/output lines GIO and GIOB in response to a local/global input/output selection signal LGIOMUX.

According to the example embodiment of the semiconductor memory device illustrated in FIGS. 1 and 2, the second equalizer control signal driver 41 for activating the inverted equalizer control signal line PEQIB is added to the sensing region SA. The second equalizer control signal driver 41 contributes to preventing characteristic degradation of the semiconductor memory device that is caused by an increase of loading of the equalizer drive signal line PEQIB_g. While FIGS. 1 and 2 show that the sensing region SA includes one second equalizer control signal driver (D) 41, two or more equalizer control signal drivers D may be disposed in the sensing region SA.

Further, in another embodiment, the second equalizer control signal driver 41 may be configured to activate the equalizer drive signal line PEQIB_g.

As previously mentioned, FIG. 2 exemplarily shows that the first and second equalizer control signal drivers 40 and 41 are formed of NMOS transistors connected between the inverted equalizer control signal line PEQIB and a ground voltage and whose gates are coupled to the equalizer control signal line PEQI. Charge is discharged from the inverted equalizer control signal line PEQIB if the equalizer control signal at a high level is applied to the gates of the NMOS transistors through the equalizer control signal line PEQI.

In another embodiment, the first and second equalizer control signal drivers 40 and 41 may be formed of PMOS transistors connected between a power source voltage and the inverted equalizer control signal line PEQIB and whose gates are coupled to the equalizer control signal line PEQI. Thereby, in this case, charge is supplied into the inverted equalizer control signal line PEQIB, raising the voltage of the inverted equalizer control signal line PEQIB to a high level, if the equalizer control signal at a low level is applied to the gates of the PMOS transistors through the equalizer control signal line PEQI.

Furthermore, in another embodiment, the first and second equalizer control signal drivers 40 and 41 may be configured to include inverters connected between the equalizer control signal line PEQI and the inverted equalizer control signal line PEQIB and inverting and outputting a signal to the equalizer control signal line PEQI. In this case, each inverter may include NMOS transistors connected between the inverted equalizer control signal line PEQIB and a ground voltage and whose gates are coupled to the equalizer control signal line PEQI, and PMOS transistors connected between a power source voltage and the inverted equalizer control signal line PEQIB and whose gates are coupled to the equalizer control signal line PEQI.

Figure 3:
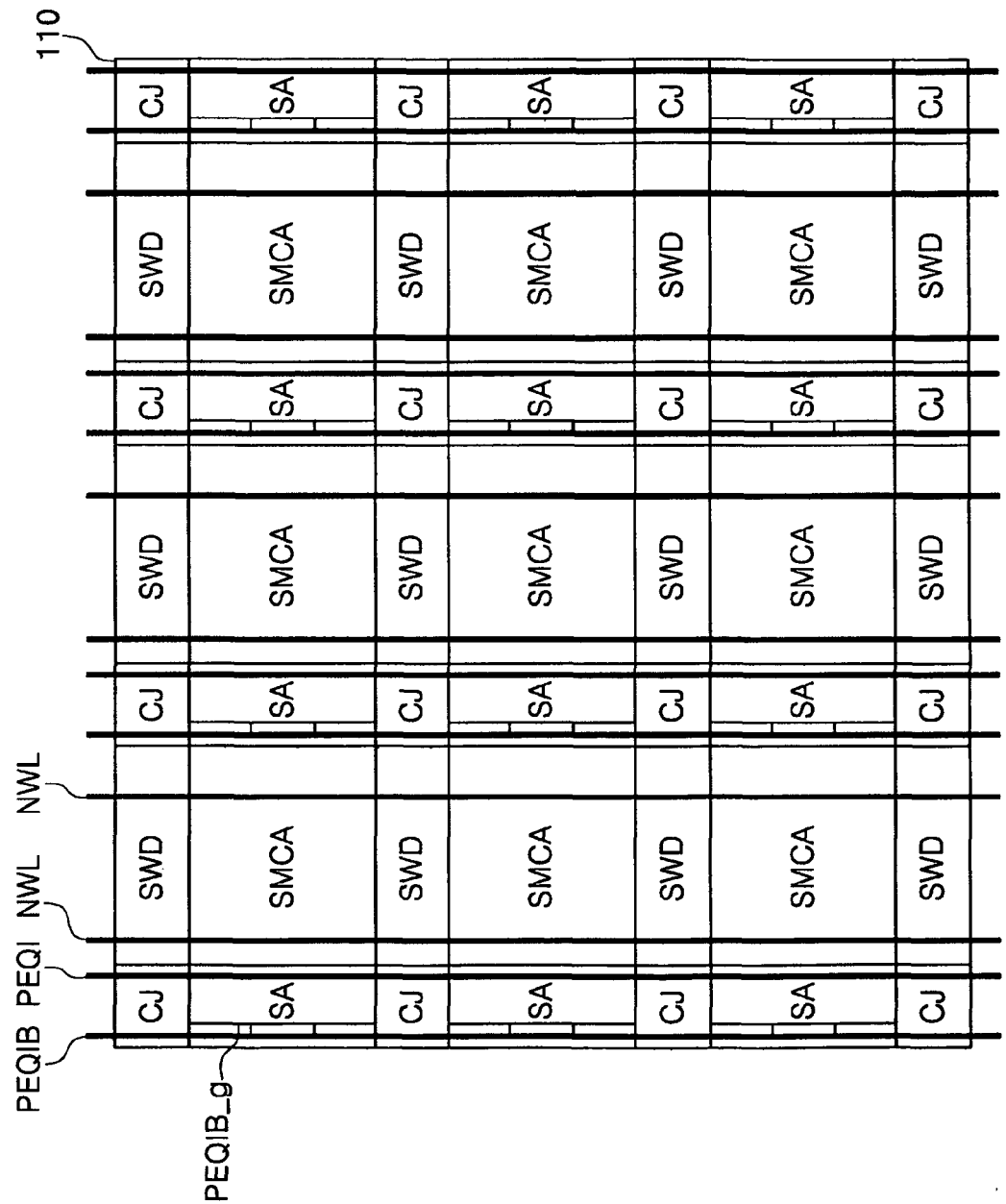
FIG. 3 is a diagram illustrating a configuration of a memory cell array according to another example embodiment.

FIG. 3 illustrates a memory cell array 110 according to another example embodiment. The signal lines and blocks indicated by the same reference numerals as those in FIG. 1 refer to the same signal lines and blocks in FIG. 3.

The blocks shown in FIG. 3 have the same function as those mentioned with reference to FIG. 1. However, this example embodiment of the semiconductor memory device shown in FIG. 3 is different from that of FIG. 1 in that the feature that the second equalizer control signal driver 41 is removed from the sensing region SA and the inverted equalizer control signal line PEQIB is strapped, or connected, with the equalizer drive signal line PEQIB_g a plurality of times in the sensing region SA.

Figure 4:
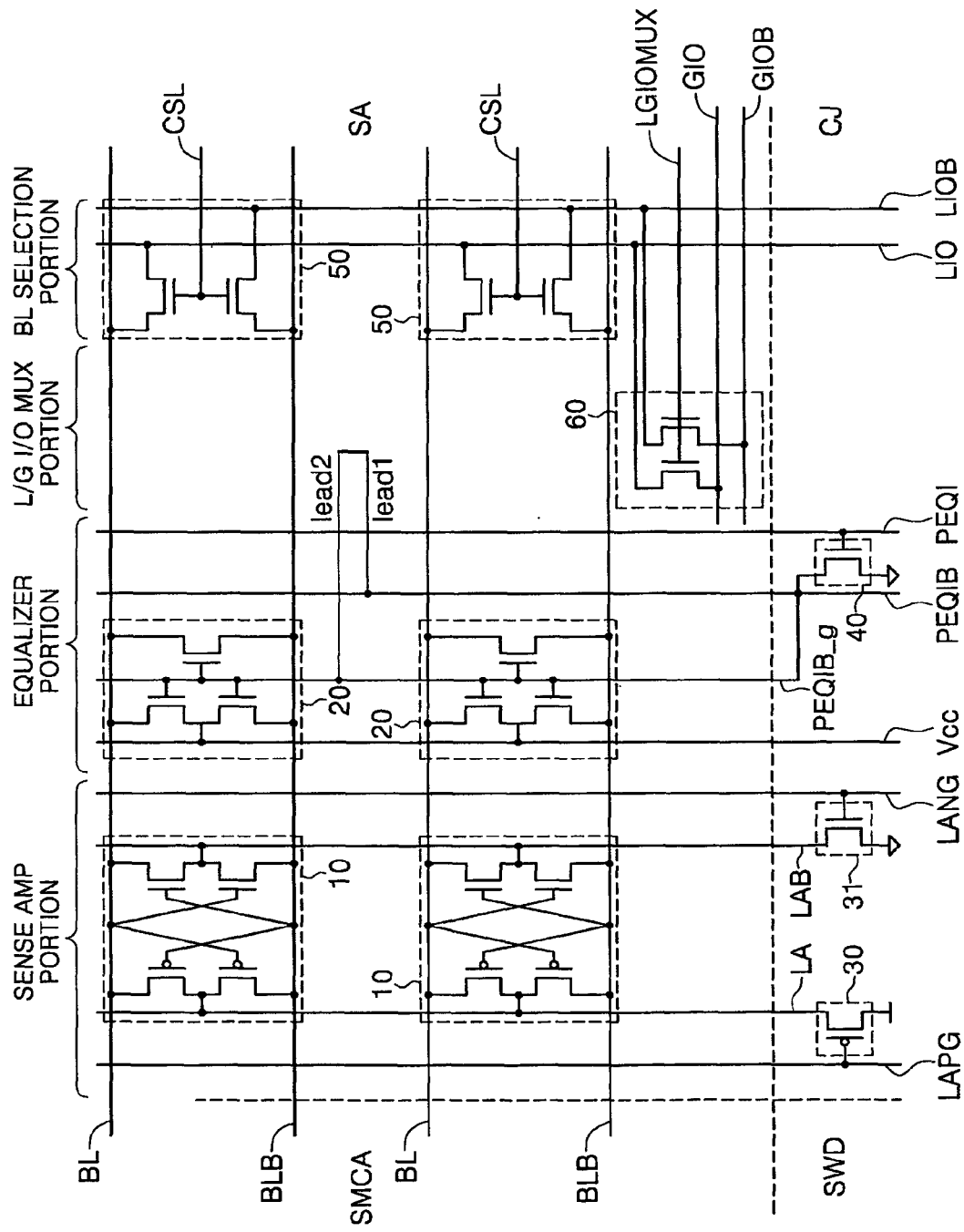
FIG. 4 is a circuit diagram partly illustrating the memory cell array of FIG. 3 in detail.

FIG. 4 partly illustrates the memory cell array 110 of FIG. 3 in detail. The signal lines and blocks indicated by the same reference numerals as those in FIG. 2 refer to the same signal lines and blocks in FIG. 4.

The blocks shown in FIG. 4 have the same function as those mentioned with reference to FIG. 2. However, this example embodiment of the semiconductor memory device shown in FIG. 4 is different from the former example embodiment in the feature that the equalizer drive signal line PEQIB_g is strapped with the inverted equalizer control signal line PEQIB in the sensing region SA. If it is difficult to directly connect the equalizer drive signal line PEQIB_g with the inverted equalizer control signal line PEQIB in the equalizer portion of the sensing region SA, the equalizer drive signal line PEQIB can be strapped with the inverted equalizer control signal line PEQIB by way of first and second leads lead1 and lead2 extending to the local/global input/output multiplexing portion. The first lead lead1 is connected to the inverted equalizer control signal line PEQIB and the second lead lead2 is connected to the equalizer drive signal line PEQIB_g.

According to the example embodiment of the semiconductor memory device illustrated in FIGS. 3 and 4, the equalizer drive signal line PEQIB_g is strapped with the inverted equalizer control signal line PEQIB in the sensing region SA, so that it is effective in preventing characteristic degradation of the semiconductor memory device that would otherwise be caused by an increase of loading of the equalizer drive signal line PEQIB_g therein. The equalizer drive signal line PEQIB_g can be strapped with the inverted equalizer control signal line PEQIB in the sensing region SA at one or more places.

Figure 5:
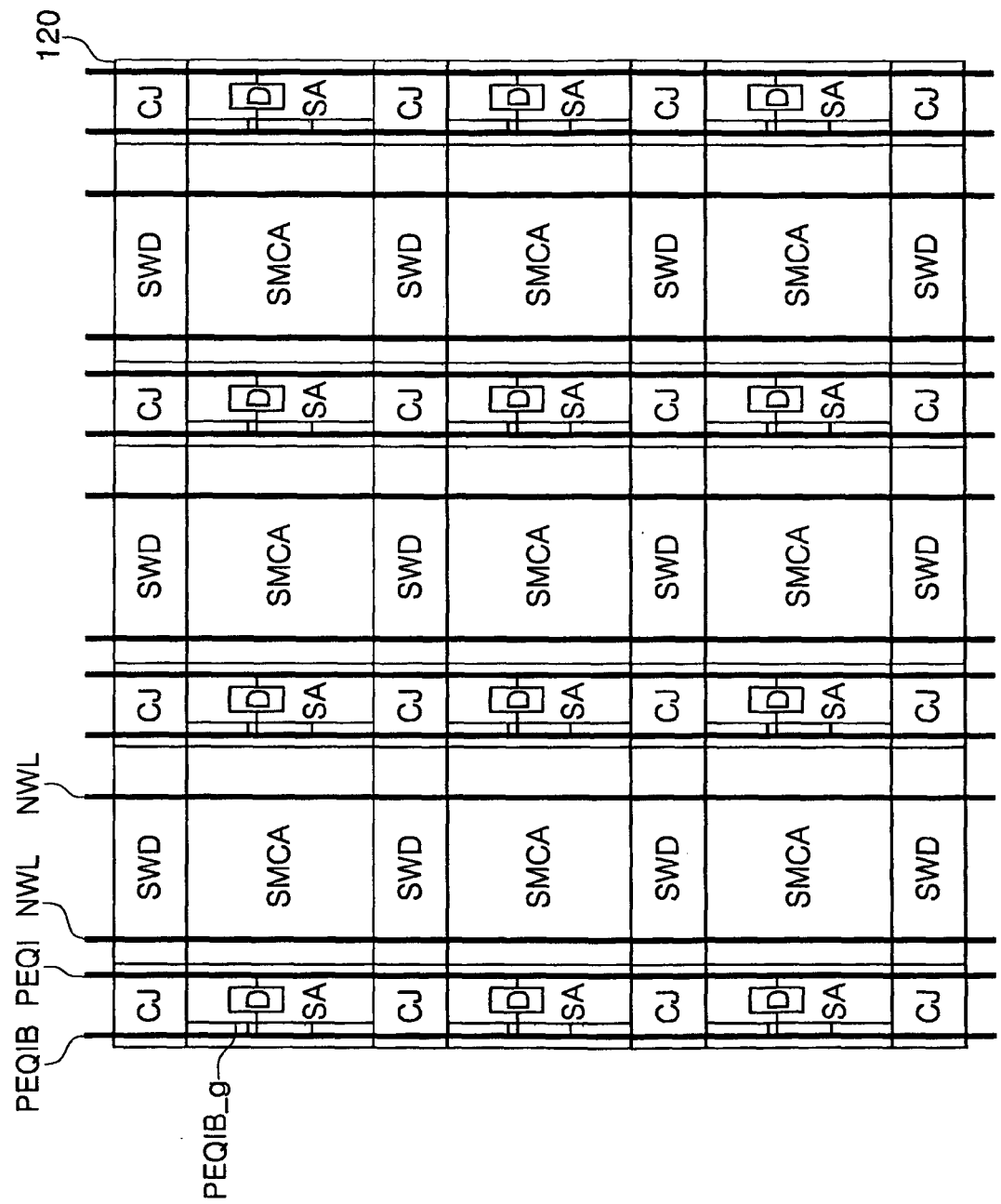
FIG. 5 is a diagram illustrating a configuration of a memory cell array according to still another example embodiment.

FIG. 5 illustrates a memory cell array 120 according to yet another example embodiment. The signal lines and blocks indicated by the same reference numerals as those in FIG. 1 refer to the same signal lines and blocks in FIG. 5.

The blocks shown in FIG. 5 have the same function as those mentioned with reference to FIG. 1. This example embodiment of the semiconductor memory device shown in FIG. 5 is characterized in that the second equalizer control signal driver 41 is additionally disposed in the sensing region SA, and the inverted equalizer control signal line PEQIB is strapped with the equalizer drive signal line PEQIB_g in the sensing region SA. As stated above, in the sensing region SA, one or more of the second equalizer control signal drivers 41 may be disposed and the equalizer drive signal line PEQIB_g may be strapped with the inverted equalizer control signal line PEQIB one or more times.

Figure 6:
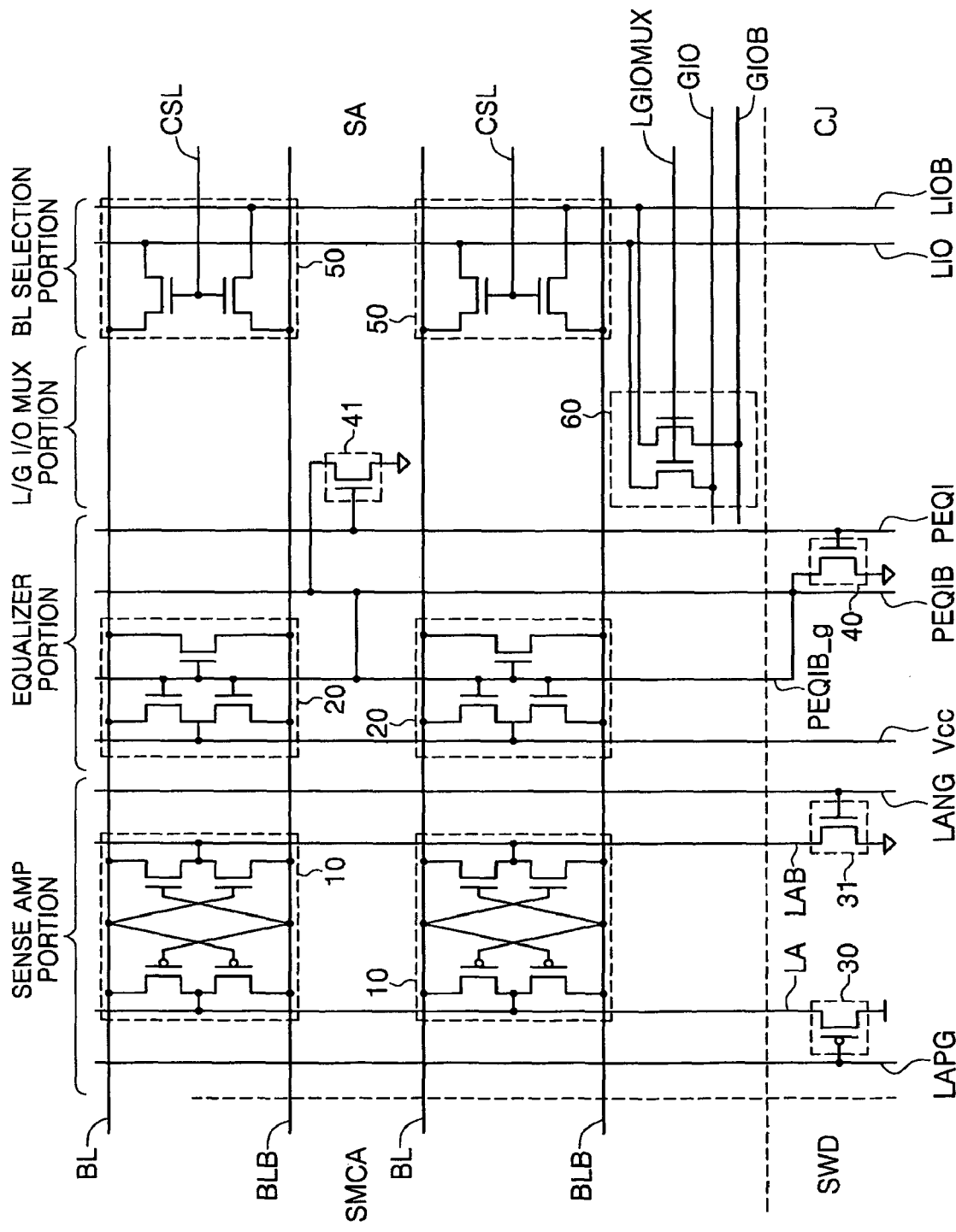
FIG. 6 is a circuit diagram partly illustrating the memory cell array of FIG. 5 in detail.

FIG. 6 partly illustrates the memory cell array 120 of FIG. 5 in detail. The signal lines and blocks indicated by the same reference numerals as those in FIG. 2 refer to the same signal lines and blocks in FIG. 6.

The example embodiment of the semiconductor memory device shown in FIGS. 5 and 6 is also effective in preventing characteristic degradation of the semiconductor memory device that would otherwise be caused by an increase of loading of the equalizer drive signal line PEQIB_g by additionally disposing the equalizer control signal driver 41 in the sensing region SA, and by also strapping the equalizer drive signal line PEQIB_g with the inverted equalizer control signal line PEQIB in the sensing region SA.

As previously mentioned, the equalizer control signal driver 41 may be disposed in the local/global input/output multiplexing portion of the sensing region SA so as not to increase a layout size of the sensing region SA. By connecting the first lead, which is connected with the inverted equalizer control signal line PEQIB, to the second lead connected to the equalizer drive signal line PEQIB_g in the local/global input/output multiplexing portion of the sensing region SA, it is possible to strap the inverted equalizer control signal line PEQIB with the equalizer drive signal line PEQIB_g.

Moreover, in the sensing region SA, one or more the equalizer control signal drivers 41 may be disposed and the equalizer drive signal line PEQIB_g may be connected to the inverted equalizer control signal line PEQIB one or more times.

While the semiconductor memory device of the aforementioned example embodiments is described such that one or more of the equalizer drive signal drivers is disposed in the sensing region SA and connected to the equalizer drive signal line, and the equalizer drive signal line is strapped with the inverted equalizer control signal line in the sensing region one or more times, the example embodiments are also applicable to other drive signal lines, which are formed of gate polycrystalline silicon in the sensing region, for activating the circuits of the sensing region.

Therefore, the semiconductor memory device according to the example embodiments is effective in lessening characteristic degradation even when loading of the drive signal lines increases in the sensing region.

As stated above, in a semiconductor memory device according to example embodiments, a control signal driver activating an inverted control signal line controlling circuits disposed in a sensing region is added to the sensing region, or a drive signal line is strapped with the inverted control signal line in the sensing region. As a result, the example embodiments are useful for improving the characteristics of the semiconductor memory device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device comprising:
   a sub memory cell array region having memory cells each connected between word lines extending in a first direction and bit lines extending in a second direction that is orthogonal to the first direction of extension of the word lines;

a sub word line driver region disposed at a side of the sub memory cell array region in the first direction and including sub word line drivers that activate the word lines;

a sensing region disposed at a side of the sub memory cell array region in the second direction and including an equalizer that precharges the bit line in response to a signal transferred through a drive signal line and at least one first control signal driver that activates an inverted control signal line in response to a signal transferred through a control signal line; and a conjunction region disposed at an intersection between the sub word line driver region and the sensing region, in which the inverted control signal line is connected to the drive signal line.

2. The device according to claim 1, wherein the conjunction region further comprises a second control signal driver configured to activate the inverted control signal line in response to the signal transferred through the control signal line.

3. The device according to claim 1, wherein the sensing region further comprises:

a sense amplifier portion configured to detect and amplify data transferred through the bit line;

an equalizer portion in which the equalizer is disposed;

a bit line selection portion in which the bit line is connected to a local data input/output line; and a local/global input/output multiplexing portion in which the local data input/output line is connected to a global data input/output line, wherein the first control signal driver is disposed in the local/global input/output multiplexing portion of the sensing region.

4. The device according to claim 3 wherein the sense amplifier portion, the equalizer portion, the local/global input/output multiplexing portion and the bit line selection portion are arranged in the sensing region side-by-side in the second direction.

5. The device according to claim 1, wherein the inverted control signal line is connected at least once to the drive signal line in the sensing region.

6. The device according to claim 5, wherein the sensing region further comprises:

a sense amplifier portion configured to detect and amplify data transferred through the bit line;

an equalizer portion in which the equalizer is disposed;

a bit line selection portion in which the bit line is connected to a local data input/output line; and a local/global input/output multiplexing portion in which the local data input/output line is connected to a global data input/output line, wherein the inverted control signal line is connected to a first lead extending to the local/global input/output multiplexing portion, the drive signal line is connected to a second lead extending to the local/global input/output multiplexing portion, and the first lead is strapped with the second lead in the local/global input/output multiplexing portion.

7. The device according to claim 5, wherein the control signal line and the inverted control signal line are formed of metal and the drive signal line is formed of gate polycrystalline silicon.

8. A semiconductor memory device comprising:

a sub memory cell array region having memory cells each connected between word lines extending in a first direction and bit lines extending in a second direction that is orthogonal to the first direction of extension of the word lines;

a sub word line driver region disposed at a side of the sub memory cell array region in a the first direction and including sub word line drivers that activate the word lines;

a sensing region disposed at a side of the sub memory cell array region in the second direction and including an equalizer that precharges the bit line in response to a signal transferred through a drive signal line; and a conjunction region disposed at an intersection between the sub word line driver region and the sensing region and including a control signal driver that activates an inverted control signal line in response to a signal transferred through a control signal line, the inverted control signal line being connected to the drive signal line in the conjunction region, wherein the drive signal line is connected at least once to the inverted control signal line in the sensing region.

9. The device according to claim 8, wherein the sensing region further comprises:

a sense amplifier portion configured to detect and amplify data transferred through the bit line;

an equalizer portion in which the equalizer is disposed;

a bit line selection portion in which the bit line is connected to a local data input/output line; and a local/global input/output multiplexing portion in which the local data input/output line is connected to a global data input/output line, wherein the inverted control signal line is connected to a first lead extending to the local/global input/output multiplexing portion, the drive signal line is connected to a second lead extending to the local/global input/output multiplexing portion, and the first lead is strapped with the second lead in the local/global input/output multiplexing portion of the sensing region.

10. The device according to claim 9, wherein the control signal line and the inverted control signal line are formed of metal and the drive signal line is formed of gate polycrystalline silicon.

* * * * *